(12) United States Patent
Saito et al.

(10) Patent No.: US 7,990,302 B2
(45) Date of Patent: Aug. 2, 2011

(54) ANALOG INPUT DEVICE

(75) Inventors: Seiichi Saito, Tokyo (JP); Yoshihiro Akeboshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/595,963

(22) PCT Filed: May 9, 2008

(86) PCT No.: PCT/JP2008/001176
§ 371 (c)(1),
(2), (4) Date: Oct. 15, 2009

(87) PCT Pub. No.: WO2008/146450
PCT Pub. Date: Dec. 4, 2008

(65) Prior Publication Data
US 2010/0164772 A1    Jul. 1, 2010

(30) Foreign Application Priority Data

May 29, 2007    (JP) ................. 2007-142223

(51) Int. Cl.
*H03M 1/12*    (2006.01)
(52) U.S. Cl. ........................ 341/155; 341/156

(58) Field of Classification Search .............. 341/155, 341/156, 159, 160, 162, 172, 118, 120, 122
See application file for complete search history.

(56) References Cited

U.S. PATENT DOCUMENTS 6,480,132 B1 *  11/2002  Yoshioka et al. ............ 341/155

FOREIGN PATENT DOCUMENTS

| JP | 58 24232 | 2/1983 |
|----|----------|--------|
| JP | 62 144233 | 6/1987 |
| JP | 7 7433 | 1/1995 |
| JP | 2002 124877 | 4/2002 |
| JP | 2004 228860 | 8/2004 |
| JP | 2006 80646 | 3/2006 |

* cited by examiner

*Primary Examiner* — Joseph Lauture
(74) *Attorney, Agent, or Firm* — Oblon, Spivak, McClelland, Maier & Neustadt, L.L.P.

(57) ABSTRACT

An amplifier for amplifying a pulse-like signal output from a secondary side of an isolating transformer, a capacitor connected to a negative feedback loop across the input and output of the amplifier, and a timing control circuit for controlling an FET into a closed state, then controlling a switch into a closed state, and after that controlling the switch into an open state at timing simultaneously with the FET or earlier than the FET are provided, and when the switch is controlled into the open state, an AD converter converts the output signal of the amplifier to a digital signal.

13 Claims, 9 Drawing Sheets

ANALOG INPUT DEVICE

TECHNICAL FIELD

The present invention relates to an analog input device for multiplexing and collecting analog signals output from a plurality of sensors, for example.

BACKGROUND ART

In an analog input device that makes multipoint input of analog signals, isolating transformers are used for insulating the individual points of the analog signals from a ground as shown in FIG. 8 to collect the analog signals at low cost while removing the effect of the ground of the signal sources.

In the analog input device, to input the low frequency analog signals including DC components while insulating from the ground, FET 11 and FET 12, which are a semiconductor switch, interrupt the analog signals successively, thereby producing pulse-like signals with amplitudes corresponding to the analog signals from the secondary sides of the isolating transformers T11 and T12.

In the analog input device, the pulse-like signals produced from the secondary sides of the isolating transformers T11 and T12 are amplified through amplifiers to a prescribed voltage, and one of the pulse-like signals is selected by a switching device SW and is brought into a sample-and-hold circuit.

The sample-and-hold circuit of the analog input device holds an instantaneous amplitude value of the pulse-like signal, and an AD converter converts the instantaneous amplitude value to a digital signal.

Here, FIG. 9 is a diagram for explaining operation timing of the conventional analog input device.

FIG. 9 illustrates that chopping operation is carried out by the FET 11 and FET 12 which turn on and off in response to input pulses to the gates of the FET 11 and FET 12.

The chopping operation causes the output sides (secondary sides) of the transformers T11 and T12 to produce pulse waveforms having amplitude $V_{t11}$ and $V_{t12}$ and transient responses.

The conventional analog input device is configured in such a manner as to start the AD conversion by sampling and holding the pulse waveform.

For example, the following Patent Document 1 discloses a switch structure of FETs inserted into the primary sides of isolating transformers of a variety of analog signals. It also discloses a configuration for carrying out AD conversion by holding an instantaneous amplitude value with a sample-and-hold circuit.

In addition, the following Patent Document 2 proposes a method of carrying out AD conversion by holding an instantaneous value of an analog signal with a sample-and-hold circuit while a digital circuit stops temporarily to avoid the effect of noise produced from the digital circuit.

Patent Document 1: Japanese Patent Laid-Open No. 58-24232/1983 (FIG. 2).

Patent Document 2: Japanese Patent Laid-Open No. 2006-80646 (Paragraphs [0037] to [0038], and FIG. 3)

With the foregoing configuration, the conventional analog input device holds the instantaneous amplitude value of the pulse-like signal with the amplitude corresponding to the analog signal with the sample-and-hold circuit. However, when receiving induction of external large noise, the amplitude value held by the sample-and-hold circuit fluctuates, offering a problem of bringing about a phenomenon that the AD conversion data is unstable.

Incidentally, in Patent Document 2, the digital circuit is stopped temporarily to avoid the effect of noise produced from the digital circuit. In this case, although the technique is effective for a noise source that can be stopped temporarily, it cannot exclude influences of external noise that cannot be stopped temporarily such as switching noise of a power source.

The present invention is implemented to solve the foregoing problems. Therefore it is an object of the present invention to provide an analog input device capable of outputting a high precision digital signal even if it receives induction of large noise from an external noise source that cannot be stopped temporarily.

DISCLOSURE OF THE INVENTION

An analog input device in accordance with the present invention includes an amplifier for amplifying a pulse-like signal while receiving the pulse-like signal output from the secondary side of an isolating transformer while a secondary side switch connected to the secondary side of the isolating transformer is controlled in a closed state, a capacitor connected to a negative feedback loop across the input and output of the amplifier, and a timing control means for controlling a primary side switch of the isolating transformer into a closed state, then for controlling the secondary side switch into the closed state, and for controlling after that the secondary side switch into an open state at timing simultaneous with the primary side switch or earlier than the primary side switch, wherein an AD converter converts, after the timing control means controls the secondary side switch into the open state, an output signal of the amplifier to a digital signal.

According to the present invention, since it is configured in such a manner that it includes an amplifier for amplifying a pulse-like signal while receiving the pulse-like signal output from the secondary side of an isolating transformer while a secondary side switch connected to the secondary side of the isolating transformer is controlled in a closed state, a capacitor connected to a negative feedback loop across the input and output of the amplifier, and a timing control means for controlling a primary side switch of the isolating transformer into a closed state, then for controlling the secondary side switch into the closed state, and for controlling after that the secondary side switch into an open state at timing simultaneous with the primary side switch or earlier than the primary side switch, wherein an AD converter converts, after the timing control means controls the secondary side switch into the open state, an output signal of the amplifier to a digital signal, it offers an advantage of being able to output a high precision digital signal even if it receives induction of large noise from an external noise source that cannot be stopped temporarily.

BEST MODE FOR CARRYING OUT THE INVENTION

The best mode for carrying out the invention will now be described with reference to the accompanying drawings to explain the present invention in more detail.

Embodiment 1

Figure 1:
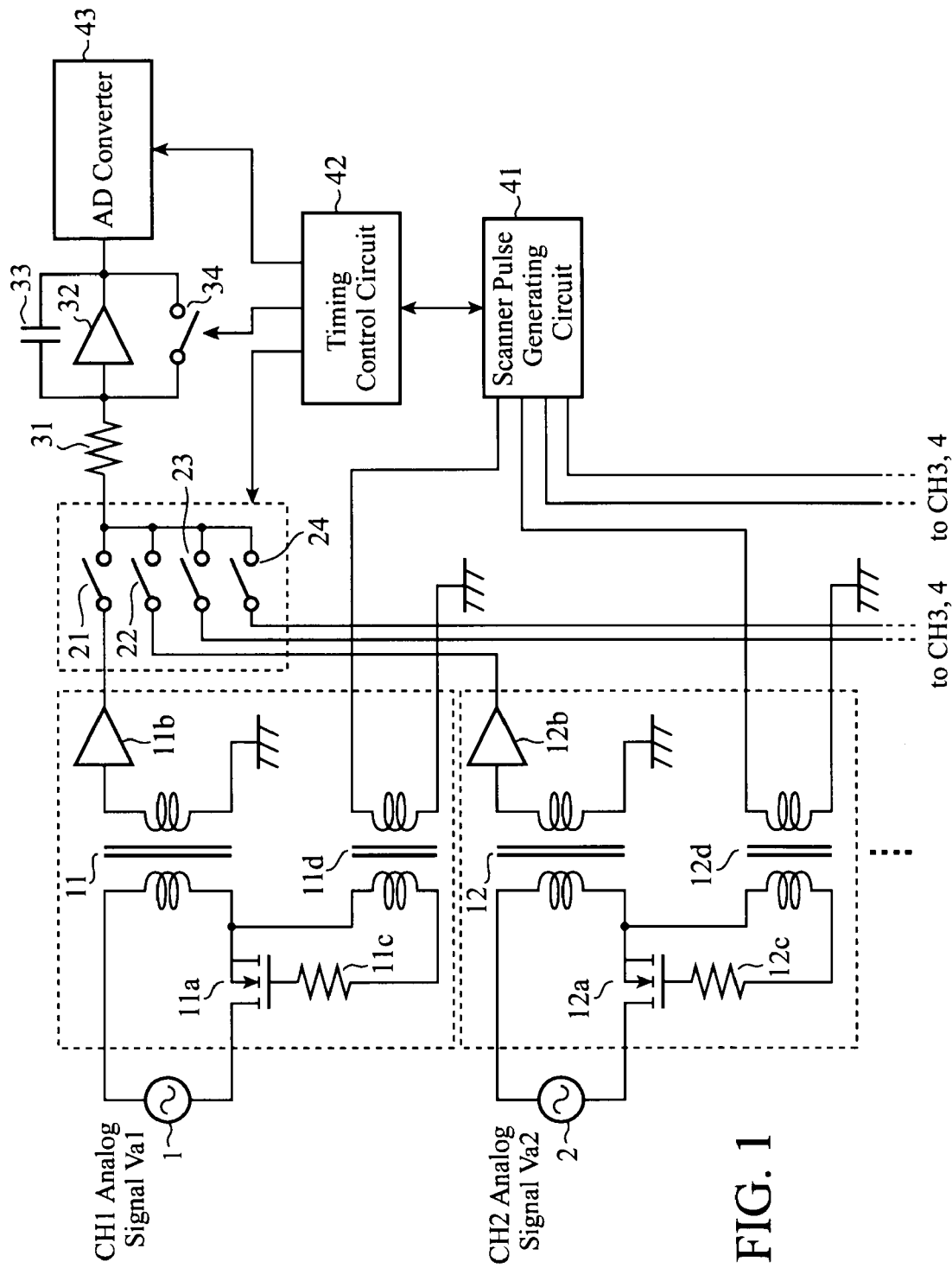
FIG. 1 is a block diagram showing a configuration of an analog input device of an embodiment 1 in accordance with the present invention.

FIG. 1 is a block diagram showing a configuration of an analog input device of an embodiment 1 in accordance with the present invention. In FIG. 1, an analog signal source 1 is a signal source such as a sensor generating a CH1 analog signal Va1.

An analog signal source 2 is a signal source such as a sensor generating a CH2 analog signal Va2.

An isolating transformer 11 outputs from its secondary side a pulse-like signal with amplitude $V_{t11}$ corresponding to the analog signal Va1 when an FET 11a serving as a primary side switch is controlled in a closed state (ON) and when the analog signal Va1 is applied from the analog signal source 1 to the primary side.

The FET 11a, which is the primary side switch inserted into the primary side of the isolating transformer 11, is brought into the closed state (ON) when inputting the analog signal Va1.

An amplifier 11b amplifies the pulse-like signal output from the secondary side of the isolating transformer 11 to a prescribed voltage.

A resistor 11c has its first terminal connected to the gate of the FET 11a and its second terminal connected to the secondary side of a driving transformer 11d.

The driving transformer 11d brings the FET 11a into the closed state (ON) by applying a pulse signal to the gate of the FET 11a when a drive pulse is output from a scanner pulse generating circuit 41.

An isolating transformer 12 outputs from its secondary side a pulse-like signal with amplitude $V_{t12}$ corresponding to the analog signal Va2 when an FET 12a serving as a primary side switch is controlled in a closed state (ON) and when the analog signal Va2 is applied from the analog signal source 2 to the primary side.

The FET 12a, which is the primary side switch inserted into the primary side of the isolating transformer 12, is brought into the closed state (ON) when inputting the analog signal Va2.

An amplifier 12b amplifies the pulse-like signal output from the secondary side of the isolating transformer 12 to a prescribed voltage.

A resistor 12c has its first terminal connected to the gate of the FET 12a and its second terminal connected to the secondary side of a driving transformer 12d.

The driving transformer 12d brings the FET 12a into the closed state (ON) by applying a pulse signal to the gate of the FET 12a when a drive pulse is output from the scanner pulse generating circuit 41.

A SW 21, which is a secondary side switch connected to the secondary side of the isolating transformer 11, is controlled into a closed state (ON) when capturing the pulse-like signal with the amplitude $V_{t11}$ corresponding to the CH1 analog signal Va1.

A SW 22, which is a secondary side switch connected to the secondary side of the isolating transformer 12, is controlled into a closed state (ON) when capturing the pulse-like signal with the amplitude $V_{t12}$ corresponding to the CH2 analog signal Va2.

A SW 23 or SW 24 is controlled into a closed state (ON) when capturing a pulse-like signal with amplitude $V_{t13}$ or $V_{t14}$ corresponding to a CH3 or CH4 analog signal Va3 or Va4.

A resistor 31 has its first terminal connected to the output side of the SW 21-SW 24, and its second terminal connected to the negative side input of an amplifier 32.

When one of the SW 21-SW 24 is controlled into the closed state (ON), the amplifier 32 integrates the pulse-like signal output from the secondary side of the isolating transformer during a period in which it is controlled in the closed state (ON) owing to the effect of the capacitor 33, and holds the value after the integral.

The capacitor 33, which is connected to the negative feedback loop across the input and output of the amplifier 32, is charged during the period in which the SW is controlled in the closed state (ON) when one of the SW 21-SW 24 is controlled into the closed state (ON).

A SW 34, which is connected in parallel with the capacitor 33, is a discharging switch controlled in a closed state (ON) while the capacitor 33 discharges its charge.

The scanner pulse generating circuit 41 supplies, when inputting the analog signal Va of any one of the channels CH, the driving transformer of the CH corresponding to the analog signal Va with a drive pulse, and controls the FET of the isolating transformer into closed state (ON).

As for a timing control circuit 42, when the scanner pulse generating circuit 41 controls, for example, the FET 11a of the isolating transformer 11 into the closed state (ON), and the output signal of the isolating transformer 11 becomes stable after a prescribed time period has elapsed from the time when the FET 11a is controlled into the closed state (ON), the timing control circuit 42 controls the SW 21 into a closed state (ON), followed by controlling the SW 21 into an open state (OFF) at timing simultaneously with the FET 11a or earlier than the FET 11a.

In addition, when the timing control circuit 42 controls the SW 21 into the open state (OFF), it issues an AD conversion instruction to an AD converter 43.

Furthermore, the timing control circuit 42 controls, before the scanner pulse generating circuit 41 outputs the drive pulse to the driving transformer 11d or the like, the SW 34 into the closed state (ON) once, and then carries out control of returning the SW 34 to the open state (OFF).

Here, the scanner pulse generating circuit 41 and timing control circuit 42 constitute a timing control means.

The AD converter 43, receiving the AD conversion instruction from the timing control circuit 42, converts the integral value held by the amplifier 32 to a digital signal.

Figure 2:
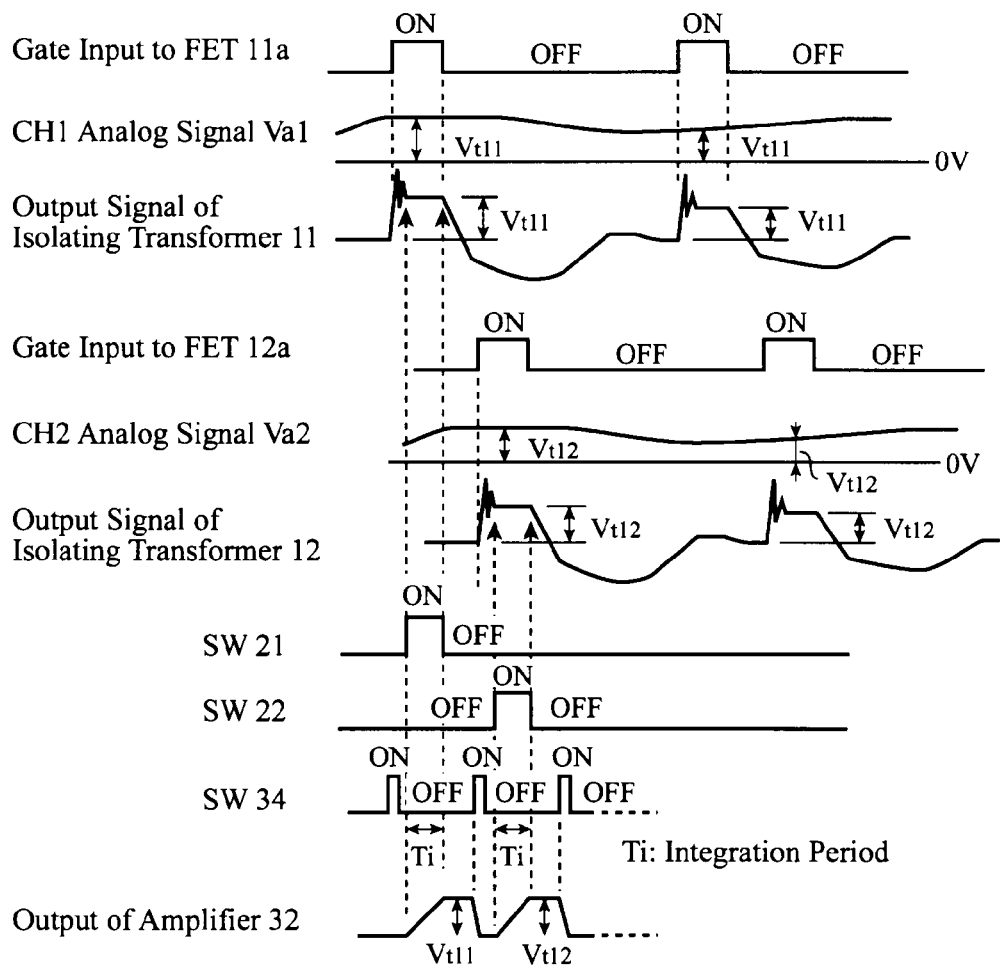
FIG. 2 is a diagram for explaining operation timing of the analog input device.

FIG. 2 is a diagram for explaining operation timing of the analog input device.

Figure 3:
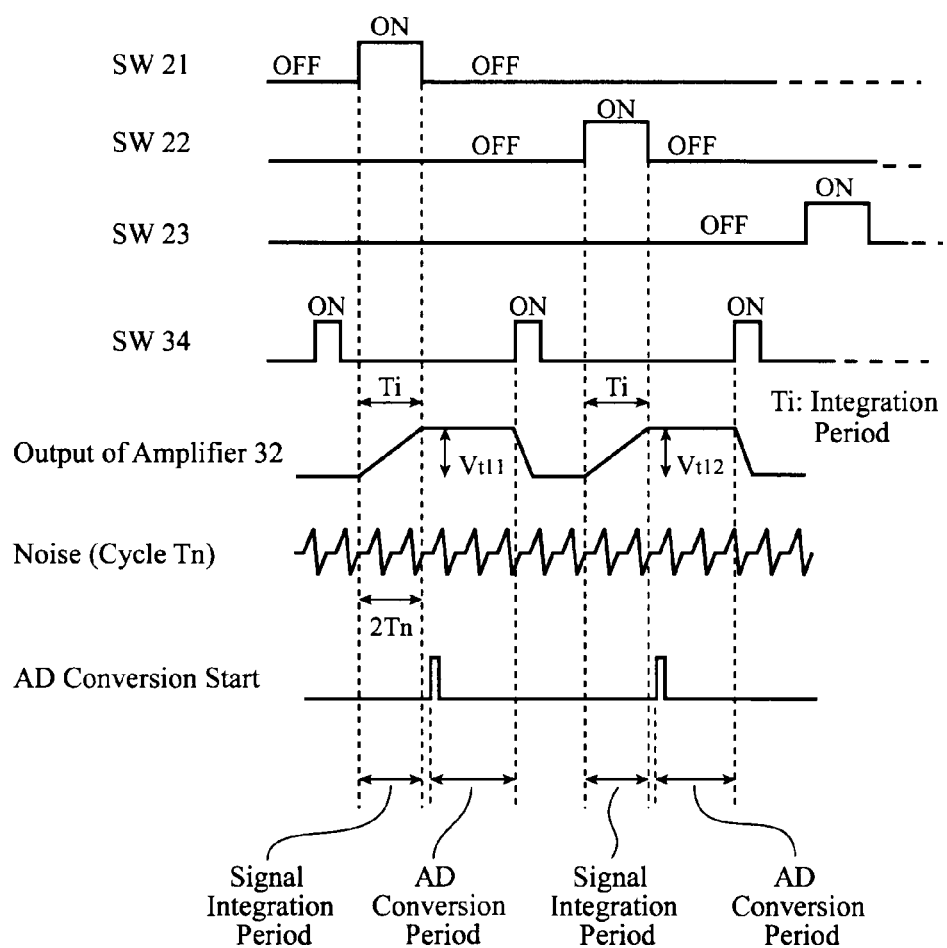
FIG. 3 is a diagram for explaining operation timing of a SW, amplifier and AD converter.

FIG. 3 is a diagram for explaining operation timing of the switches SW, amplifier and AD converter.

Next, the operation will be described.

When inputting the CH1 analog signal Va1, for example, the timing control circuit 42 controls the SW 34 into the closed state (ON) to discharge the capacitor 33 as shown in FIG. 2.

After the discharge has been completed, the timing control circuit 42 controls the SW 34 into the open state (OFF). In addition, it supplies the scanner pulse generating circuit 41 with the output instruction of the drive pulse to the CH1 driving transformer 11*d*.

The scanner pulse generating circuit 41, receiving the output instruction of the drive pulse to the CH1 driving transformer 11*d* from the timing control circuit 42, outputs the drive pulse to the CH1 driving transformer 11*d*.

The CH1 driving transformer 11*d*, receiving the drive pulse from the scanner pulse generating circuit 41, brings the FET 11*a* into the closed state (ON) by applying the pulse signal to the gate of the FET 11*a* as shown in FIG. 2.

The isolating transformer 11 outputs the pulse-like signal with the amplitude $V_{t11}$ corresponding to analog signal Va1 from the secondary side as shown in FIG. 2 while the FET 11*a* is controlled in a closed state (ON) and the analog signal Va1 is applied to the primary side from the CH1 analog signal source 1.

The amplifier 11*b*, receiving the pulse-like signal from the secondary side of the isolating transformer 11, amplifies the pulse-like signal to the prescribed voltage.

The timing control circuit 42 controls the SW 21 into the closed state (ON) when the scanner pulse generating circuit 41 controls the FET 11*a* into the closed state (ON).

In this case, however, immediately after the scanner pulse generating circuit 41 controls the FET 11*a* into the closed state (ON), the amplitude of the pulse-like signal output from the secondary side of the isolating transformer 11 has a ringing during the transient response as shown in FIG. 2. Thus, the timing control circuit 42 controls the SW 21 into the closed state (ON) after the output signal of the isolating transformer 11 becomes stable after the prescribed time period has elapsed after the scanner pulse generating circuit 41 controls the FET 11*a* into the closed state (ON).

Incidentally, as for the timing at which the timing control circuit 42 controls the SW 21 into the open state (OFF), to maintain the stable state of the pulse-like signal, the timing is made simultaneous with the timing at which the scanner pulse generating circuit 41 controls the FET 11*a* into the open state (OFF), or a little earlier than the timing at which the scanner pulse generating circuit 41 controls the FET 11*a* into the open state (OFF).

As described above, when the timing control circuit 42 controls the SW 21 into the closed state (ON), the pulse-like signal output from the secondary side of the isolating transformer 11 is applied to the negative side input of the amplifier 32 as long as the SW 21 is controlled in the closed state (ON).

Thus, the capacitor 33 is charged as long as the SW 21 is controlled in the closed state (ON) so that the amplifier 32 integrates the pulse-like signal output from the secondary side of the isolating transformer, and holds the value after the integral.

FIG. 2 shows that the output voltage of the amplifier 32 gradually increases as long as the SW 21 is controlled in the closed state (ON).

In this way, as long as the SW 21 is controlled in the closed state (ON), the pulse-like signal output from the secondary side of the isolating transformer is integrated and the value after the integral is held. Accordingly, the noise superposed on the pulse-like signal is averaged, and the effect of the noise is reduced.

Incidentally, in the example of FIG. 3, the time during which the SW 21 is controlled in the closed state (ON) is adjusted to the duration in which two cycles of the noise is induced so that the influence of the noise is canceled out by the integral effect.

Although the time during which the SW 21 is controlled in the closed state (ON) is adjusted to the duration in which two cycles of the noise is induced in FIG. 3, it is not necessary to be limited to the two cycles of the noise. For example, just adjusting it to an integer multiple of the cycle of the noise makes it possible to cancel out the effect of the noise by the integral effect.

After that, the timing control circuit 42 controls the SW 21 into the open state (OFF), and then outputs the AD conversion instruction to the AD converter 43 as shown in FIG. 3.

Receiving the AD conversion instruction from the timing control circuit 42, the AD converter 43 converts the integral value held by the amplifier 32 to a digital signal.

Up to this point, although the description is made as to the case where the CH1 analog signal Va1 is input, it is also applicable to the case of inputting the CH2, CH3 or CH4 analog signal Va.

For example, to input the CH2 analog signal Va2, the switching control of the FET 12*a* and SW 22 is carried out instead of the FET 11*a* and SW 21.

As is clear from the foregoing description, according to the present embodiment 1, since it is configured in such a manner that it comprises, for example, the amplifier 32 for amplifying the pulse-like signal while receiving the pulse-like signal output from the secondary side of the isolating transformer 11 after the SW 21 connected to the secondary side of the isolating transformer 11 is controlled into the closed state; the capacitor 33 connected to the negative feedback loop across the input and output of the amplifier 32; and the timing control circuit 42 for controlling the FET 11*a* of the isolating transformer 11 into the closed state, followed by controlling the SW 21 into the closed state, and then controlling the SW 21 into the open state at the timing simultaneously with the FET 11*a* or earlier than the FET 11*a*, wherein the AD converter 43 converts the output signal of the amplifier 32 to the digital signal when the timing control circuit 42 controls the SW 21 into the open state. Accordingly, the present embodiment 1 offers an advantage of being able to output a high precision digital signal even if it receives induction of large noise from an external noise source that cannot be stopped temporarily.

Embodiment 2

Figure 4:
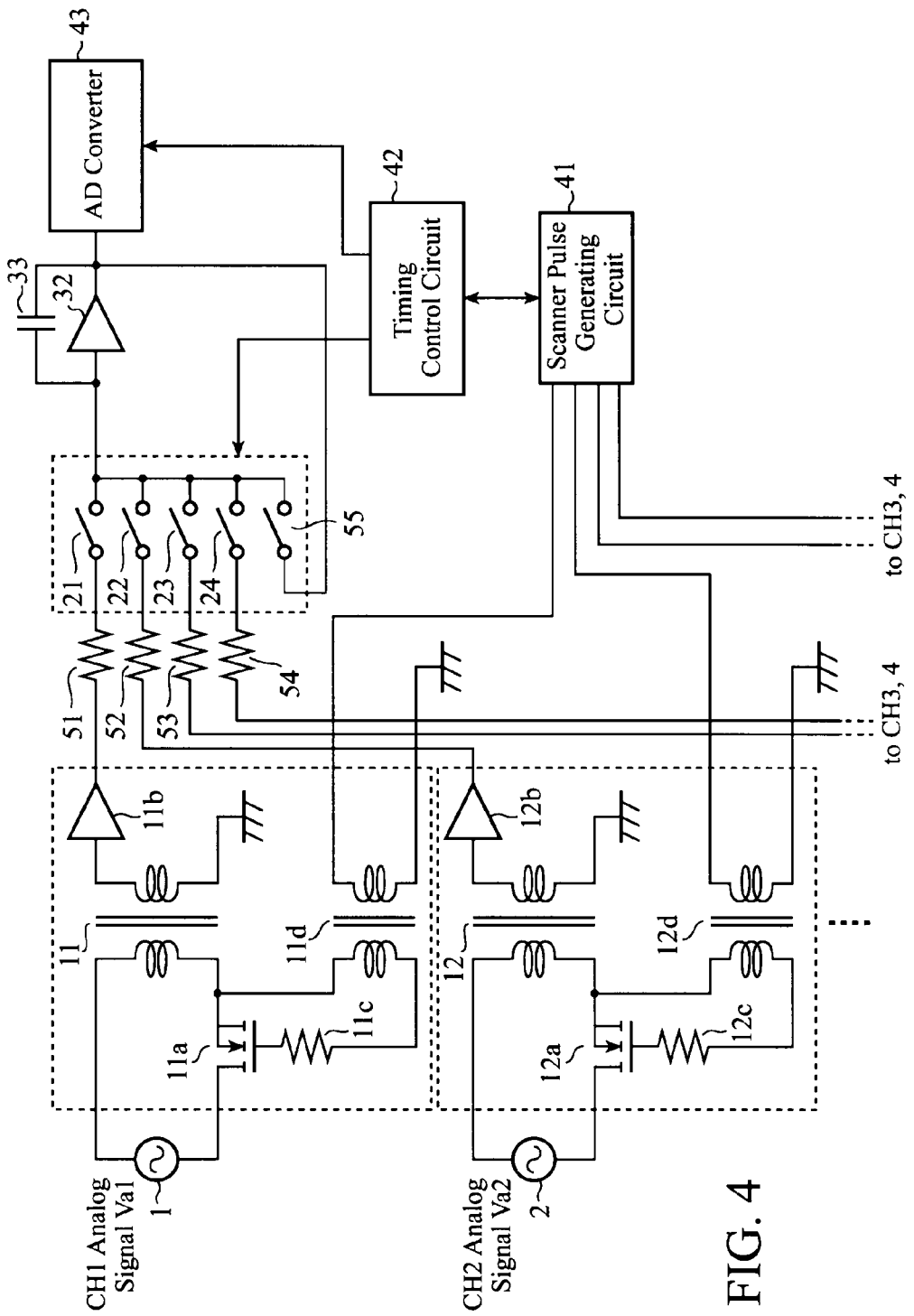
FIG. 4 is a block diagram showing a configuration of an analog input device of an embodiment 2 in accordance with the present invention.

FIG. 4 is a block diagram showing a configuration of an analog input device of an embodiment 2 in accordance with the present invention. In FIG. 4, since the same reference numerals as those of FIG. 1 designate the same or like components, their description will be omitted here.

A resistor 51 is inserted between the amplifier 11*b* and the SW 21 in series.

A resistor 52 is inserted between the amplifier 12*b* and the SW 22 in series.

Likewise, resistors 53 and 54 are inserted between amplifiers of the secondary sides of isolating transformers and the SW 23 and SW 24 in series.

A SW 55, which is a discharging switch connected in parallel with the capacitor 33 and controlled into a closed state (ON) to discharge the capacitor 33, differs from the SW 34 of FIG. 1 in that the output side of the SW 55 is connected in common with the output side of the SW 21-SW 24.

As for the operation in which the analog input device inputs the analog signal and converts it to the digital signal, although it is the same as that of the foregoing embodiment 1, since the output side of the SW 21-SW 24 and the output side of the SW 55 are connected in common, the SW 21-SW 24 and the SW 55 can be integrated into the same IC chip.

Thus, the present embodiment 2 differs from the foregoing embodiment 1 in that the SW 21-SW 24 and the SW 55 are formed into the same single IC chip.

Embodiment 3

Figure 5:
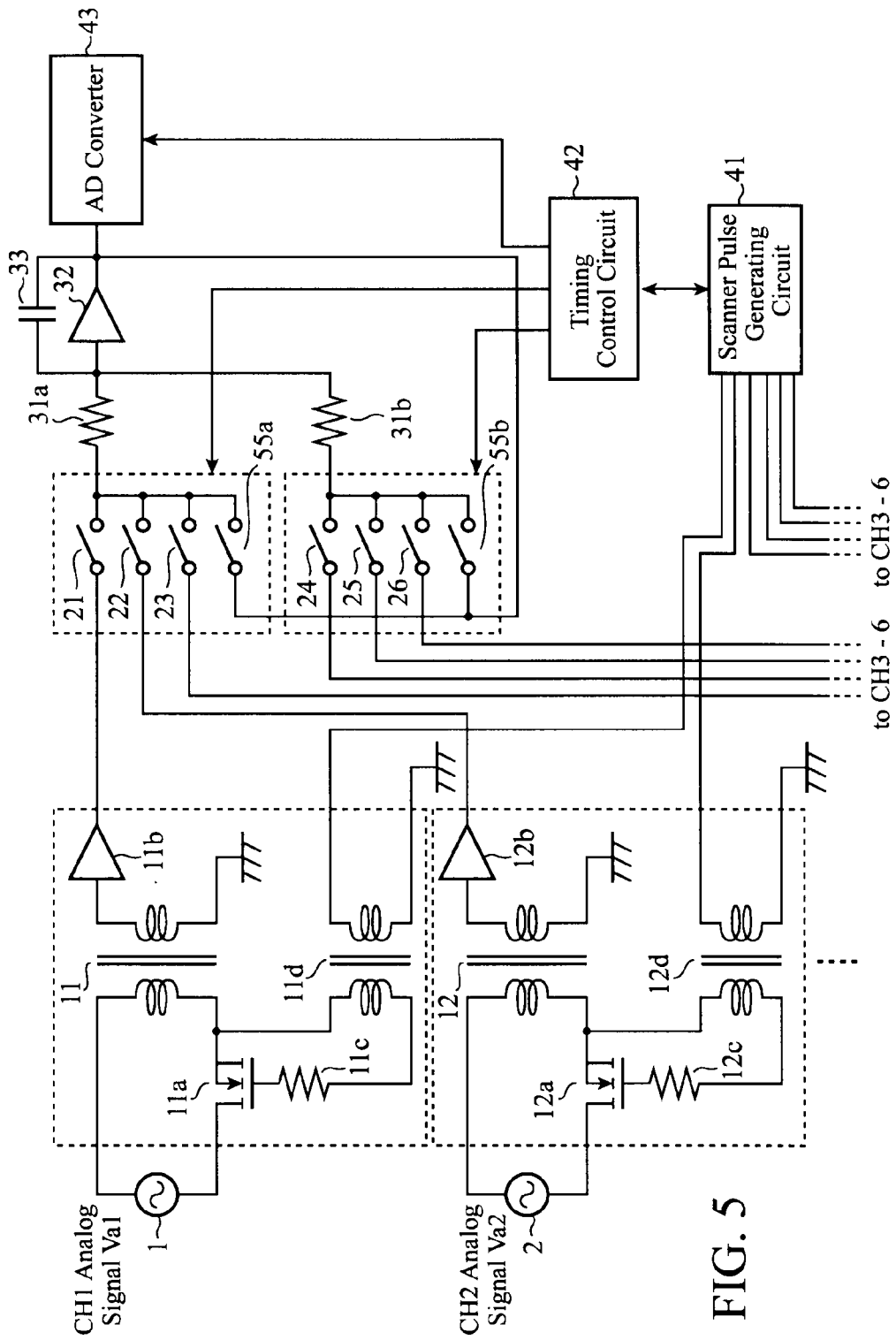
FIG. 5 is a block diagram showing a configuration of an analog input device of an embodiment 3 in accordance with the present invention.

FIG. 5 is a block diagram showing a configuration of an analog input device of an embodiment 3 in accordance with the present invention. In FIG. 3, since the same reference numerals as those of FIG. 1 designate the same or like components, their description will be omitted here.

A SW 25 or SW 26 is controlled into a closed state (ON) when capturing a pulse-like signal with amplitude $V_{t15}$ or $V_{t16}$ corresponding to an analog signal Va5 or Va6 of CH5 or CH6.

A resistor 31a has its first terminal connected to the output side of the SW 21, SW 22, SW 23 and SW 55a, and its second terminal connected to the negative side input of the amplifier 32.

A resistor 31b has its first terminal connected to the output side of the SW 24, SW 25, SW 26 and SW 55b, and its second terminal connected to the negative side input of the amplifier 32.

The SW 55a is a discharging switch connected in parallel with the capacitor 33 and controlled into a closed state (ON) to discharge the capacitor 33. However, it differs from the SW 34 of FIG. 1 in that the SW 55a has its output side connected in common with the output side of the SW 21, SW 22, and SW 23.

The SW 55b is a discharging switch connected in parallel with the capacitor 33 and controlled into a closed state (ON) to discharge the capacitor 33. However, it differs from the SW 34 of FIG. 1 in that the SW 55b has its output side connected in common with the output side of the SW 24, SW 25, and SW 26.

Although the foregoing embodiment 2 shows the example that integrates the SW 21-SW 24 and the SW 55 into the same IC chip, it is also possible as shown in FIG. 5 to divide the SW 21-SW 26, the SW 55a and SW 55b into two groups, and to integrate each SW group into the same IC chip.

In the example of FIG. 5, since the output sides of the SW 21, SW 22 and SW 23 are connected in common with the output side of the SW 55a, the SW 21, SW 22 and SW 23 and the SW 55a can be integrated into the same IC chip.

Likewise, since the output sides of the SW 24, SW 25 and SW 26 are connected in common with the output side of the SW 55b, the SW 24, SW 25 and SW 26 and the SW 55b can be integrated into the same IC chip.

Embodiment 4

Figure 6:
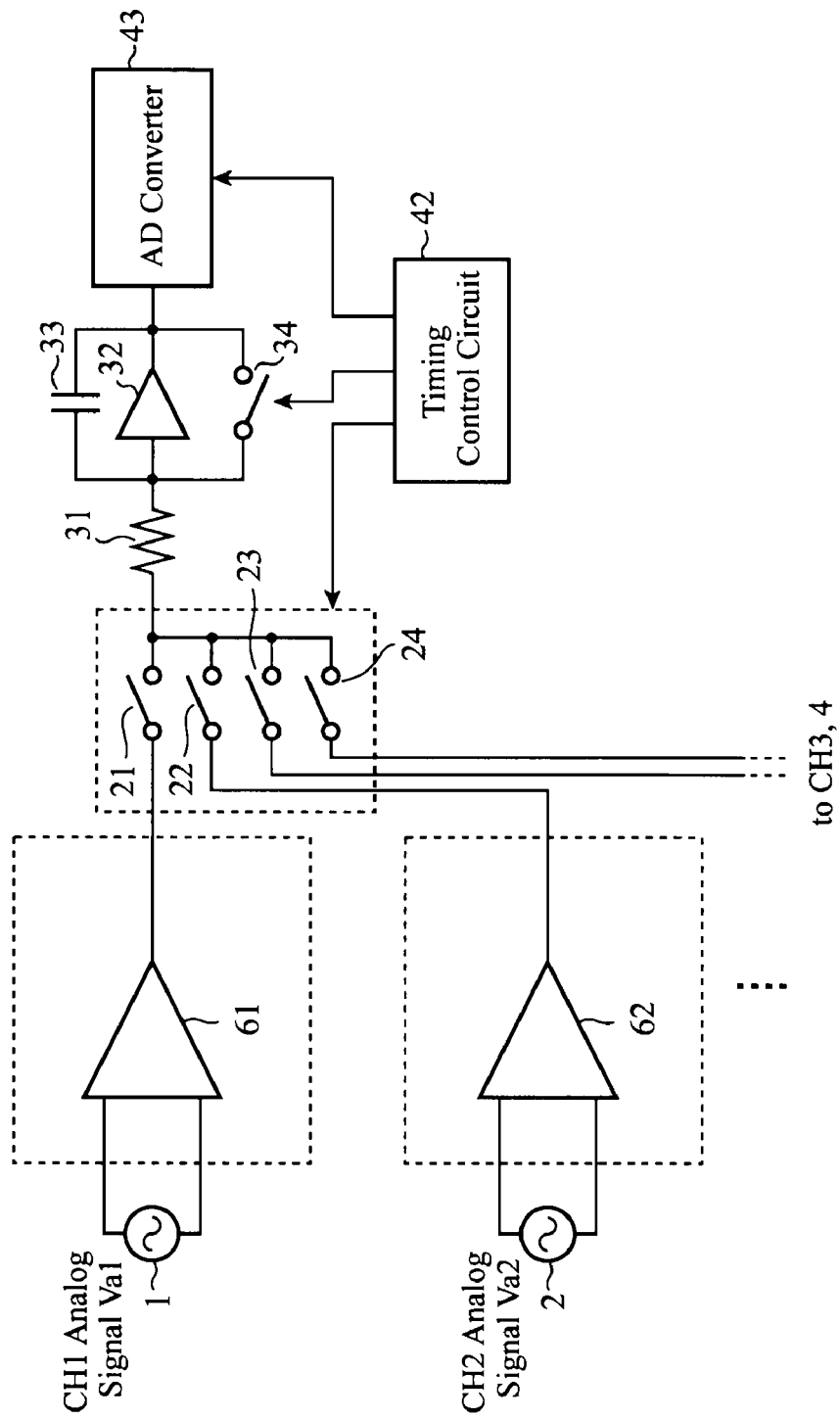
FIG. 6 is a block diagram showing a configuration of an analog input device of an embodiment 4 in accordance with the present invention.

FIG. 6 is a block diagram showing a configuration of an analog input device of an embodiment 4 in accordance with the present invention. In FIG. 6, since the same reference numerals as those of FIG. 1 designate the same or like components, their description will be omitted here.

A differential amplifier 61 receives the analog signal Va1 output from the analog signal source 1, amplifies the analog signal Va1 to a prescribed voltage, and outputs to the SW 21 which is a selecting switch.

A differential amplifier 62 receives the analog signal Va2 output from the analog signal source 2, amplifies the analog signal Va2 to a prescribed voltage, and outputs to the SW 22 which is a selecting switch.

Figure 7:
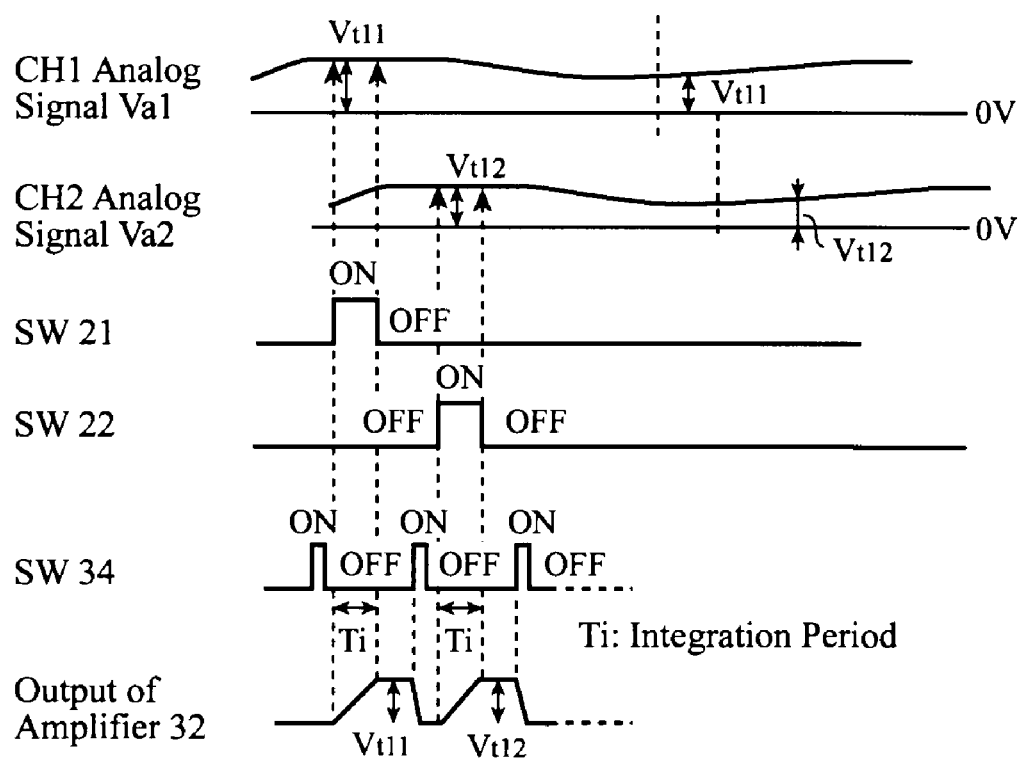
FIG. 7 is a diagram for explaining operation timing of the analog input device.
Figure 8:
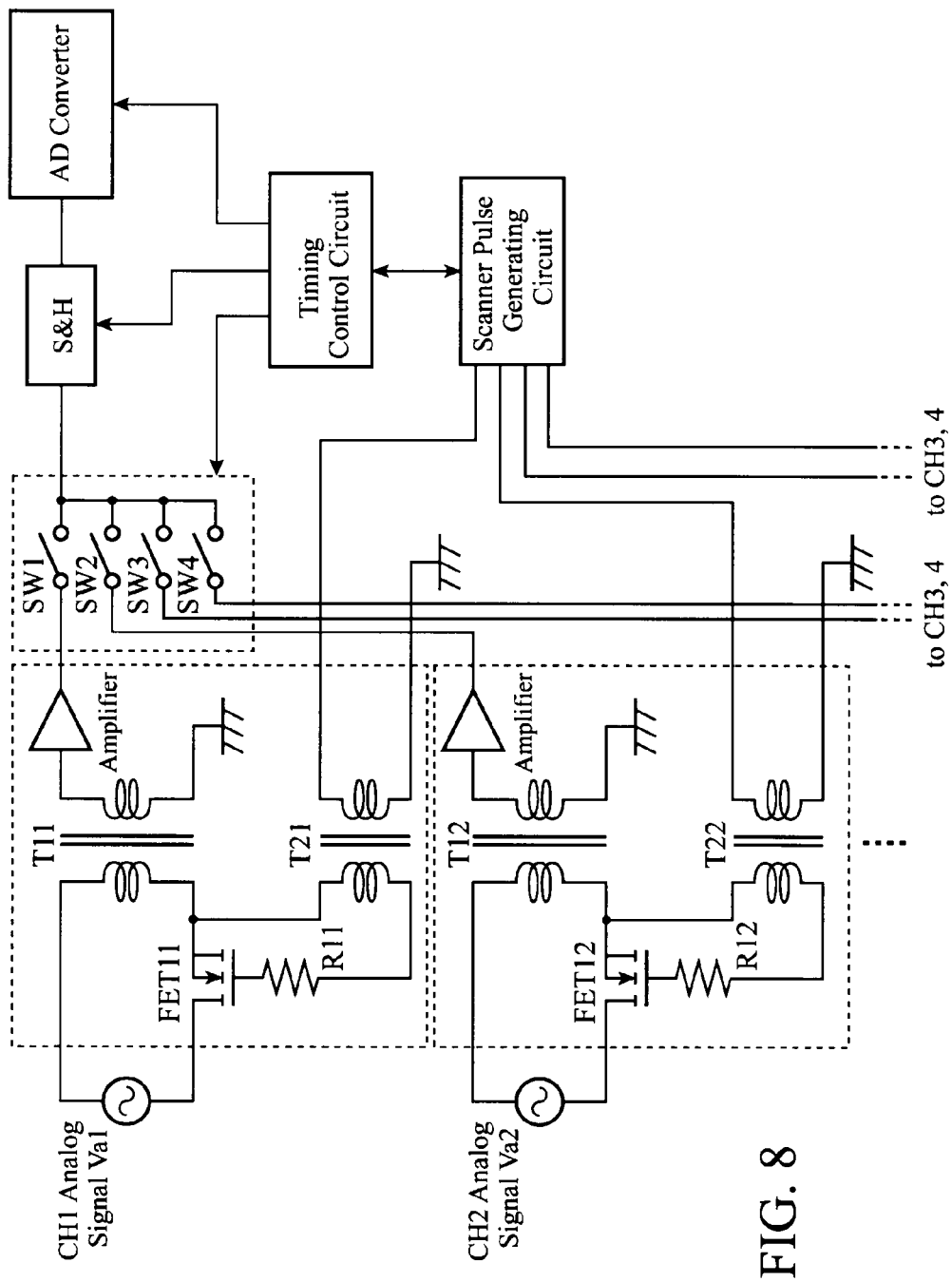
FIG. 8 is a block diagram showing a configuration of an conventional analog input device.
Figure 9:
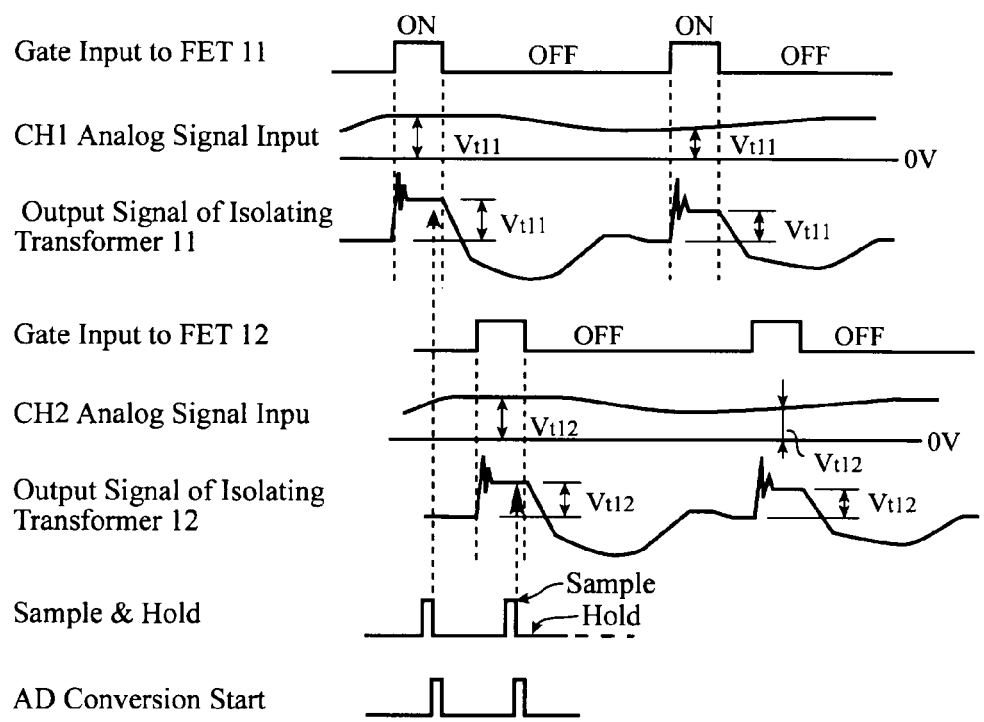
FIG. 9 is a diagram for explaining operation timing of the conventional analog input device.

FIG. 7 is a diagram for explaining operation timing of the analog input device.

Next, the operation will be described.

When inputting the CH1 analog signal Va1, for example, the timing control circuit 42 controls the SW 34 into the closed state (ON) to discharge the capacitor 33 as shown in FIG. 7.

After the discharge has been completed, the timing control circuit 42 controls the SW 34 into the open state (OFF).

In addition, after controlling the SW 34 into the open state (OFF), the timing control circuit 42 controls the SW 21 into the closed state (ON).

The differential amplifier 61 receives the analog signal Va1 output from the analog signal source 1, amplifies the analog signal Va1 to the prescribed voltage, and outputs to the SW21. The analog signal Va1 is applied to the negative side input of the amplifier 32 via the SW 21 and resistor 31.

Thus, the capacitor 33 is charged as long as the SW 21 is controlled in the closed state (ON) so that the amplifier 32 integrates the analog signal Va1, and holds the value after the integral.

FIG. 7 shows that the output voltage of the amplifier 32 gradually increases as long as the SW 21 is controlled in the closed state (ON).

In this way, as long as the SW 21 is controlled in the closed state (ON), the analog signal Va1 is integrated and the value after the integral is held. Accordingly, the noise superposed on the analog signal Va1 is averaged, and the effect of the noise is reduced.

After that, the timing control circuit 42 controls the SW 21 into the open state (OFF), and then outputs the AD conversion instruction to the AD converter 43.

Receiving the AD conversion instruction from the timing control circuit 42, the AD converter 43 converts the integral value held by the amplifier 32 to a digital signal.

Up to this point, although the description is made as to the case where the CH1 analog signal Va1 is input, it is also applicable to the case of inputting the CH2, CH3 or CH4 analog signal Va.

For example, to input the CH2 analog signal Va2, the switching control of the SW 22 is carried out instead of the SW 21.

As is clear from the foregoing description, the present embodiment 4 also offers an advantage of being able to output the high precision digital signal as the foregoing embodiment 1 even if it receives the induction of large noise from an external noise source that cannot be stopped temporarily.

INDUSTRIAL APPLICABILITY

As described above, the analog input device in accordance with the present invention can output the high precision digital signal even if it receives induction of large noise from an external noise source by connecting a capacitor to the negative feedback loop across the input and output of the amplifier. Accordingly, it is suitable for applications to various sensors such as voltage sensors, current sensors and pressure sensor.

What is claimed is:

1. An analog input device comprising:
   isolating transformers each for outputting, while a primary side switch is controlled in a closed state and an analog signal is applied to a primary side, a pulse-like signal with amplitude corresponding to the analog signal from a secondary side;
   secondary side switches connected to the secondary sides of the isolating transformers;
   an amplifier for amplifying the pulse-like signal output from the secondary side of one of the isolating transformers while one of the secondary side switches is controlled in a closed state;

a capacitor connected to a negative feedback loop across an input and output of the amplifier;

timing control means for controlling the primary side switch of one of the isolating transformers into the closed state, then for controlling the corresponding secondary side switch into the closed state, and for controlling after that the secondary side switch into an open state at timing simultaneous with the primary side switch or earlier than the primary side switch; and an AD converter for converting, after the timing control means controls the secondary side switch into the open state, an output signal of the amplifier to a digital signal.

2. The analog input device according to claim 1, wherein when a plurality of isolating transformers are mounted, the amplifier has its negative side input connected to output sides of the secondary side switches connected to secondary sides of the plurality of isolating transformers.

3. The analog input device according to claim 2, wherein the timing control means adjusts duration from controlling one of the secondary side switches into the closed state to controlling it into the open state to an integer multiple of a cycle of noise.

4. The analog input device according to claim 1, further comprising:

a discharging switch connected in parallel with the capacitor, wherein the timing control means controls, before controlling the primary side switch of one of the isolating transformers into the closed state, the discharging switch into a closed state once, and then returns the discharging switch to an open state.

5. The analog input device according to claim 4, wherein output sides of the plurality of secondary side switches and an output side of the discharging switch are connected in common, and the plurality of secondary side switches and the discharging switch are integrated into a same IC chip.

6. The analog input device according to claim 5, further comprising:

a plurality of divisions each including the plurality of secondary side switches and the discharging switch.

7. The analog input device according to claim 4, wherein the timing control means adjusts duration from controlling one of the secondary side switches into the closed state to controlling it into the open state to an integer multiple of a cycle of noise.

8. The analog input device according to claim 1, wherein the timing control means adjusts duration from controlling one of the secondary side switches into the closed state to controlling it into the open state to an integer multiple of a cycle of noise.

9. An analog input device comprising:

differential amplifiers each for amplifying an analog signal;

selecting switches connected to output sides of the differential amplifiers;

an amplifier for amplifying the analog signal amplified by one of the differential amplifiers while the corresponding selecting switch is controlled in a closed state;

a capacitor connected to a negative feedback loop across an input and output of the amplifier;

a resistor connected to outputs of the selecting switches and the input of the amplifier;

timing control means for controlling one of the selecting switches into the closed state, and after that controlling the selecting switch into an open state; and an AD converter for controlling, when the timing control means controls the selecting switch into the open state, an output signal of the amplifier to a digital signal.

10. The analog input device according to claim 9, wherein when the plurality of differential amplifiers are mounted, the amplifier has its negative side input connected to output sides of the selecting switches via the resistor which are connected to output sides of the plurality of differential amplifiers.

11. The analog input device according to claim 10, further comprising:

a discharging switch connected in parallel with the capacitor, wherein the timing control means controls, before controlling the selecting switch into the closed state, the discharging switch into a closed state once, and then returns the discharging switch to an open state.

12. The analog input device according to claim 9, further comprising:

a discharging switch connected in parallel with the capacitor, wherein the timing control means controls, before controlling the selecting switch into the closed state, the discharging switch into a closed state once, and then returns the discharging switch to an open state.

13. The analog input device according to claim 9, wherein a different source generates each analog signal amplified by each respective differential amplifier.

* * * * *